(12) United States Patent
Jeon et al.

(10) Patent No.: US 12,268,061 B2
(45) Date of Patent: Apr. 1, 2025

(54) DISPLAY DEVICE

(71) Applicant: Samsung Display Co., Ltd., Yongin-si (KR)

(72) Inventors: Yujin Jeon, Yongin-si (KR); Wonse Lee, Yongin-si (KR); Sukyoung Kim, Yongin-si (KR); Donghyeon Jang, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 566 days.

(21) Appl. No.: 17/022,826

(22) Filed: Sep. 16, 2020

(65) Prior Publication Data

US 2021/0305347 A1     Sep. 30, 2021

(30) Foreign Application Priority Data

Mar. 26, 2020   (KR) .................. 10-2020-0037057

(51) Int. Cl.
| | |
|---|---|
| *H01L 27/32* | (2006.01) |
| *H10K 50/842* | (2023.01) |
| *H10K 59/131* | (2023.01) |
| *G09G 3/3233* | (2016.01) |

(52) U.S. Cl.
CPC ....... *H10K 59/131* (2023.02); *H10K 50/8426* (2023.02); *G09G 3/3233* (2013.01); *G09G 2300/0426* (2013.01)

(58) Field of Classification Search
CPC ......... G02F 1/136209; G02F 1/136227; G02F 1/136286; G09G 3/3233; G09G 2300/0426; G09G 2300/0819; G09G 2300/0842; G09G 2300/0861; G09G 2310/0262; H10K 50/8426; H10K 59/1213; H10K 59/1216;
(Continued)

(56) References Cited

U.S. PATENT DOCUMENTS

| | | |
|---|---|---|
| 8,188,649 B2 | 5/2012 | Sung et al. |
| 9,147,724 B2 | 9/2015 | Moon et al. |
| 9,412,802 B2 | 8/2016 | Hyun et al. |

(Continued)

FOREIGN PATENT DOCUMENTS

| | | |
|---|---|---|
| CN | 109273484 | 1/2019 |
| CN | 110098222 | 8/2019 |

(Continued)

*Primary Examiner* — Stacy Khoo

(74) *Attorney, Agent, or Firm* — KILE PARK REED & HOUTTEMAN PLLC

(57) ABSTRACT

A display device includes a substrate including a display area and a non-display area; pixels arranged in the display area, each of the pixels including a pixel circuit and a light-emitting diode; a driving voltage supply line arranged in the non-display area, the driving voltage supply line supplying a driving voltage to the pixels; a common voltage supply line arranged in the non-display area and electrically connected to an opposite electrode of the light-emitting diode to supply a common voltage; and a seal portion surrounding the display area. The common voltage supply line, the driving voltage supply line, and the seal portion are arranged in a direction away from the display area in an order of the common voltage supply line, the driving voltage supply line, and the seal portion.

20 Claims, 9 Drawing Sheets

(58) Field of Classification Search
CPC .. H10K 59/122; H10K 59/123; H10K 59/124; H10K 59/131; H10K 59/1315
See application file for complete search history.

(56) References Cited

U.S. PATENT DOCUMENTS

| | | | |
|---|---|---|---|
| 10,170,534 B1* | 1/2019 | Kim | H01L 27/124 |
| 10,186,680 B2 | 1/2019 | Lee | |
| 2015/0144922 A1* | 5/2015 | Moon | H10K 59/131 |
| | | | 257/40 |
| 2018/0374914 A1* | 12/2018 | Maeda | H01L 27/124 |
| 2019/0027076 A1 | 1/2019 | Lee et al. | |
| 2019/0043938 A1* | 2/2019 | Lee | H10K 59/122 |
| 2019/0237527 A1 | 8/2019 | Lee et al. | |
| 2021/0202675 A1* | 7/2021 | Jang | H10K 59/131 |

FOREIGN PATENT DOCUMENTS

| | | |
|---|---|---|
| JP | 2019-8187 | 1/2019 |
| KR | 10-0864882 | 10/2008 |
| KR | 10-2015-0039490 | 4/2015 |
| KR | 10-2016-0056487 | 5/2016 |
| KR | 10-1661015 | 9/2016 |
| KR | 10-2018-0104225 | 9/2018 |
| KR | 10-2019-0014610 | 2/2019 |

* cited by examiner

DISPLAY DEVICE

CROSS-REFERENCE TO RELATED APPLICATION(S)

This application claims the benefit of Korean Patent Application No. 10-2020-0037057 under 35 U.S.C. § 119, filed in the Korean Intellectual Property Office on Mar. 26, 2020, the disclosure of which is incorporated herein in its entirety by reference.

BACKGROUND

1. Field of the Invention

The present disclosure relates to a display device.

2. Description of the Related Art

In general, display devices may be used in mobile devices, such as smartphones, laptop computers, digital cameras, camcorders, portable information terminals, notebook computers, or tablet personal computers, or may be used in electronic devices, such as desktop computers, televisions, outdoor advertisement boards, display devices for exhibitions, dashboards for vehicles, or head-up displays (HUDs).

A display device includes various circuits to provide an image, and the circuits may be arranged in a non-display area outside a display area where the image is displayed. In the non-display area, various wiring lines, which transmit electrical signals to the display area, a gate driver, a data driver, and a controller may be provided.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

In general, display devices are becoming not only more versatile but also thinner and lighter. As display devices can be used in various ways, it may be advantageous to increase a display area that provides an image and reduce a non-display area that does not provide an image.

One or more embodiments include a display device comprising a reduced non-display area while maintaining the performance of the display device.

According to one or more embodiments, a display device may include a substrate including a display area displaying an image and a non-display area adjacent to the display area; a plurality of pixels arranged in the display area, each of the plurality of pixels including a pixel circuit and a light-emitting diode including a pixel electrode electrically connected to the pixel circuit, an emission layer, and an opposite electrode; a driving voltage supply line arranged in the non-display area, the driving voltage supply line supplying a driving voltage to the plurality of pixels; a common voltage supply line arranged in the non-display area and electrically connected to the opposite electrode to supply a common voltage; and a seal portion surrounding the display area. The common voltage supply line, the driving voltage supply line, and the seal portion may be arranged in a direction away from the display area in an order of the common voltage supply line, the driving voltage supply line, and the seal portion.

In an embodiment, the common voltage supply line may be electrically connected to the opposite electrode through a connection electrode. The connection electrode and the pixel electrode may be arranged on a same layer.

In an embodiment, the display device may further comprise an auxiliary common voltage supply line arranged between the common voltage supply line and the display area, and a switching circuit including at least one thin film transistor arranged between the common voltage supply line and the auxiliary common voltage supply line. The at least one thin film transistor may supply a data signal to the plurality of pixels.

In an embodiment, the common voltage supply line and the auxiliary common voltage supply line may include a same stacked structure and may be electrically connected to each other through the connection electrode.

In an embodiment, an area in which the common voltage supply line, the auxiliary common voltage supply line, the connection electrode, and the opposite electrode are electrically connected to one another, may be arranged around an upper portion of the switching circuit.

In an embodiment, the connection electrode electrically connected to the opposite electrode may be arranged on the common voltage supply line.

In an embodiment, the driving voltage supply line may include a conductive line electrically connected to the plurality of pixels through the common voltage supply line and through an area where the common voltage supply line and the opposite electrode are electrically connected to each other.

In an embodiment, a planarization layer including at least one layer may cover the common voltage supply line, the connection electrode may be arranged on the planarization layer and may be electrically connected to the common voltage supply line through a contact hole of the planarization layer, and the opposite electrode may be electrically connected to the connection electrode through an opening of a pixel-defining layer covering at least a portion of the pixel electrode.

In an embodiment, display area may include a thin film transistor having a semiconductor layer, a gate electrode, a source electrode, and a drain electrode; a first planarization layer provided in the planarization layer covering the source electrode; a conductive line on the first planarization layer; and a second planarization layer provided in the planarization layer covering the conductive line, wherein the common voltage supply line may include a first layer and a second layer, the first layer and the source electrode may be arranged on a same layer, and the second layer and the conductive line may be arranged on a same layer.

In an embodiment, the connection electrode may include a plurality of holes, the pixel-defining layer may cover an edge of the connection electrode in which the plurality of holes are arranged, and the opening of the pixel-defining layer may expose a portion of the connection electrode electrically connected to the opposite electrode.

In an embodiment, the display area may include a thin film transistor having a semiconductor layer, a gate electrode, a source electrode, and a drain electrode; a first planarization layer covering the source electrode; a conductive line on the first planarization layer; and a second planarization layer covering the conductive line, wherein the driving voltage supply line may include a first layer and a second layer, the first layer and the source electrode may be arranged on a same layer, and the second layer and the conductive line may be arranged on a same layer.

In an embodiment, the driving voltage supply line may be arranged adjacent to the seal portion.

In an embodiment, at least a portion of the seal portion may overlap the driving voltage supply line.

According to one or more embodiments, a display device may include a substrate including a display area displaying an image and a non-display area adjacent to the display area; a plurality of pixels arranged in the display area, each of the plurality of pixels including a pixel circuit and a light-emitting diode including a pixel electrode electrically connected to the pixel circuit, an emission layer, and an opposite electrode; a driving voltage supply line arranged in the non-display area, the driving voltage supply line supplying a driving voltage to the plurality of pixels; and a common voltage supply line arranged in the non-display area and electrically connected to the opposite electrode to supply a common voltage, wherein the common voltage supply line may be electrically connected to the opposite electrode through a connection electrode, and the connection electrode and the pixel electrode may be arranged on a same layer.

In an embodiment, a planarization layer including at least one layer may cover the common voltage supply line, the connection electrode may be arranged on the planarization layer and may be electrically connected to the common voltage supply line through a contact hole of the planarization layer, and the opposite electrode may be electrically connected to the connection electrode through an opening of a pixel-defining layer covering at least a portion of the pixel electrode.

In an embodiment, the connection electrode may include a plurality of holes, the pixel-defining layer may cover an edge of the connection electrode in which the plurality of holes are arranged, and the opening of the pixel-defining layer may expose a portion of the connection electrode electrically connected to the opposite electrode.

In an embodiment, the display area may include a thin film transistor having a semiconductor layer, a gate electrode, a source electrode, and a drain electrode; a first planarization layer covering the source electrode; a conductive line on the first planarization layer; and a second planarization layer covering the conductive line, wherein the driving voltage supply line may include a first layer and a second layer, the first layer and the source electrode may be arranged on a same layer, and the second layer and the conductive line may be arranged on a same layer.

In an embodiment, the display device may further comprise an auxiliary common voltage supply line electrically connected to the common voltage supply line through the connection electrode, the auxiliary common voltage supply line being arranged between the common voltage supply line and the display area, and a switching circuit including at least one thin film transistor arranged between the common voltage supply line and the auxiliary common voltage supply line. The at least one thin film transistor may supply a data signal to the plurality of pixels.

In an embodiment, the auxiliary common voltage supply line, the switching circuit, the common voltage supply line, and the driving voltage supply line may be arranged in a direction away from the display area in an order of the auxiliary common voltage supply line, the switching circuit, the common voltage supply line, and the driving voltage supply line.

In an embodiment, the common voltage supply line and the driving voltage supply line may be arranged in a direction away from the display area in an order of the common voltage supply line and the driving voltage supply line.

BRIEF DESCRIPTION OF THE DRAWINGS

The above and other aspects, features, and advantages of embodiments of the disclosure will be more apparent from the following description taken in conjunction with the accompanying drawings, in which.

DETAILED DESCRIPTION OF THE EMBODIMENTS

Figure 1:
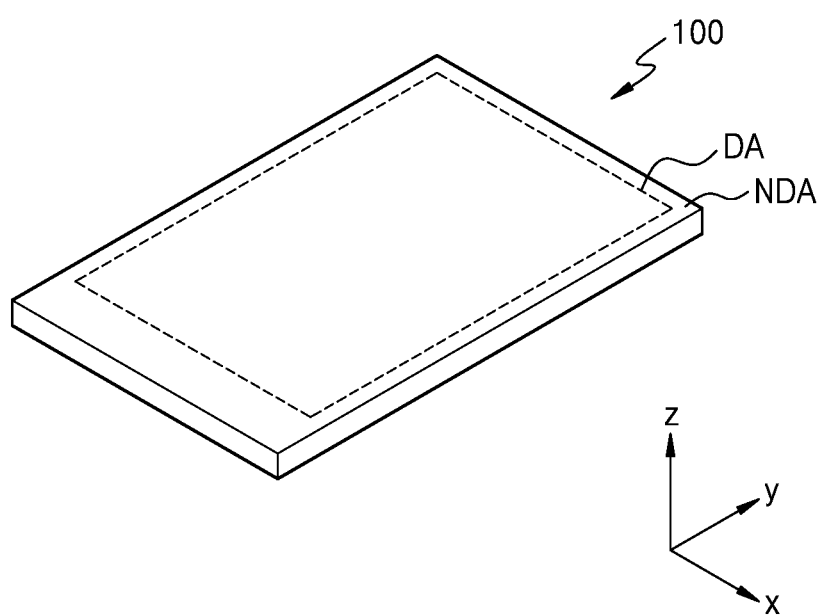
FIG. 1 is a schematic perspective view illustrating a display device according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the present disclosure.

As used herein, the term "and/or" may include any and all combinations of one or more of the associated listed items. Throughout the disclosure, the expression "at least one of a, b or [or 'and'] c" indicates only a, only b, only c, both a and b, both a and c, both b and c, all of a, b, and c, or variations thereof.

As the disclosure allows for various changes and numerous embodiments, particular embodiments will be illustrated in the drawings and described in detail in the written description. Effects and features of the disclosure and methods of accomplishing the same may be understood more readily by reference to the following detailed description of preferred embodiments and the accompanying drawings. The disclosure may, however, be embodied in many different forms and should not be construed as being limited to the embodiments set forth herein.

When a layer, film, region, substrate, or area, is referred to as being "on" another layer, film, region, substrate, or area, it may be directly on the other film, region, substrate, or area, or intervening films, regions, substrates, or areas, may be present therebetween. Conversely, when a layer, film, region, substrate, or area, is referred to as being "directly on" another layer, film, region, substrate, or area, intervening layers, films, regions, substrates, or areas, may be absent therebetween. Further when a layer, film, region, substrate, or area, is referred to as being "below" another layer, film, region, substrate, or area, it may be directly below the other layer, film, region, substrate, or area, or intervening layers, films, regions, substrates, or areas, may be present therebetween. Conversely, when a layer, film, region, substrate, or area, is referred to as being "directly below" another layer, film, region, substrate, or area, intervening layers, films, regions, substrates, or areas, may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Throughout the specification, the x-axis, the y-axis, and the z-axis are not limited to three axes on an orthogonal coordinates system and may be interpreted as a broader sense. For example, the x-axis, the y-axis, and the z-axis may be orthogonal to one another, but may refer to different directions that are not orthogonal to one another.

Further, in the specification, the phrase "in a plan view" means when an object portion is viewed from above, and the phrase "in a cross-sectional view" means when a cross-section taken by vertically cutting an object portion is viewed from the side. Additionally, the terms "overlap" or "overlapped" means that a first object may be above or below a second object, and vice versa.

It will be understood that although terms such as "first" and "second" may be used herein to describe various components, these components should not be limited by these terms and these terms are only used to distinguish one component from another component.

Also, as used herein, the singular forms "a," "an," and "the" are intended to include the plural forms as well, unless the context clearly indicates otherwise.

Also, it will be understood that the terms "comprise," "include," and "have" used herein specify the presence of stated features or components, but do not preclude the presence or addition of one or more other features or components.

When the embodiments are described with reference to the accompanying drawings, the same reference numerals are assigned to the same or corresponding components, and redundant descriptions thereof may be omitted.

In the following embodiments, when layers, regions, or components are connected to each other, the layers, the regions, or the components may be directly connected to each other, or another layer, another region, or another component may be interposed between the layers, the regions, or the components and thus the layers, the regions, or the components may be indirectly connected to each other. For example, in the following embodiments, when layers, regions, or components are electrically connected to each other, the layers, the regions, or the components may be directly electrically connected to each other, or another layer, another region, or another component may be interposed between the layers, the regions, or the components and thus the layers, the regions, or the components may be indirectly electrically connected to each other.

FIG. 1 is a schematic perspective view illustrating a display device 100 according to an embodiment.

Referring to FIG. 1, the display device 100 includes a display area DA and a non-display area NDA adjacent to the display area DA. The display device 100 may display an image through the display area DA. The display device 100 may include a liquid crystal display, an electrophoretic display, an organic light-emitting display, an inorganic light-emitting display, a quantum dot light-emitting display, a field emission display, a surface-conduction electron-emitter display, a plasma display, or a cathode ray display.

Hereinafter, an exemplary organic light-emitting display device will be described as a display device 100 according to an embodiment. However, the display device 100 is not limited thereto, and various types of display devices may be used as the display device 100.

Figure 2A:
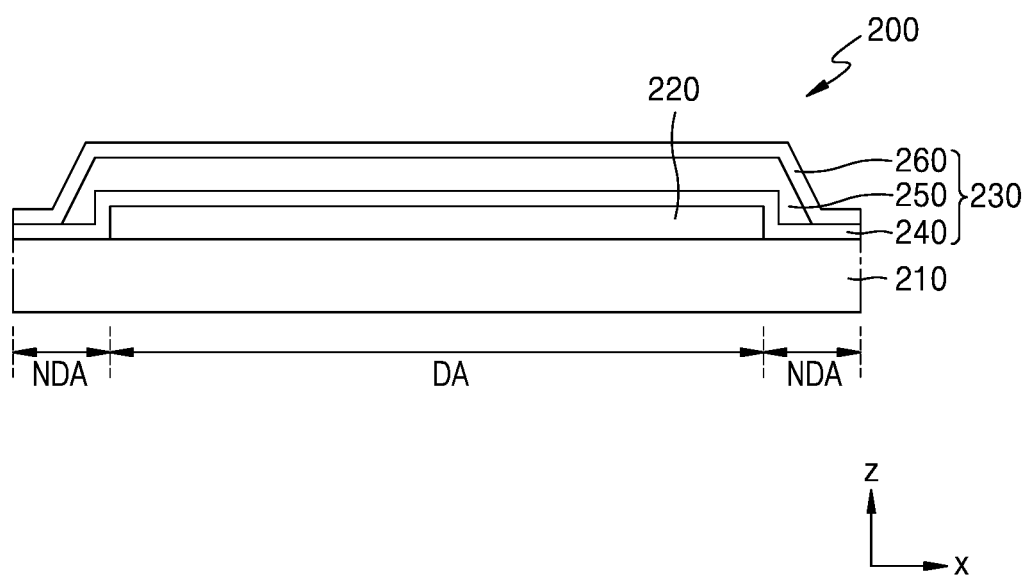
FIGS. 2A and 2B are schematic cross-sectional views illustrating a display device according to an embodiment.
Figure 2B:
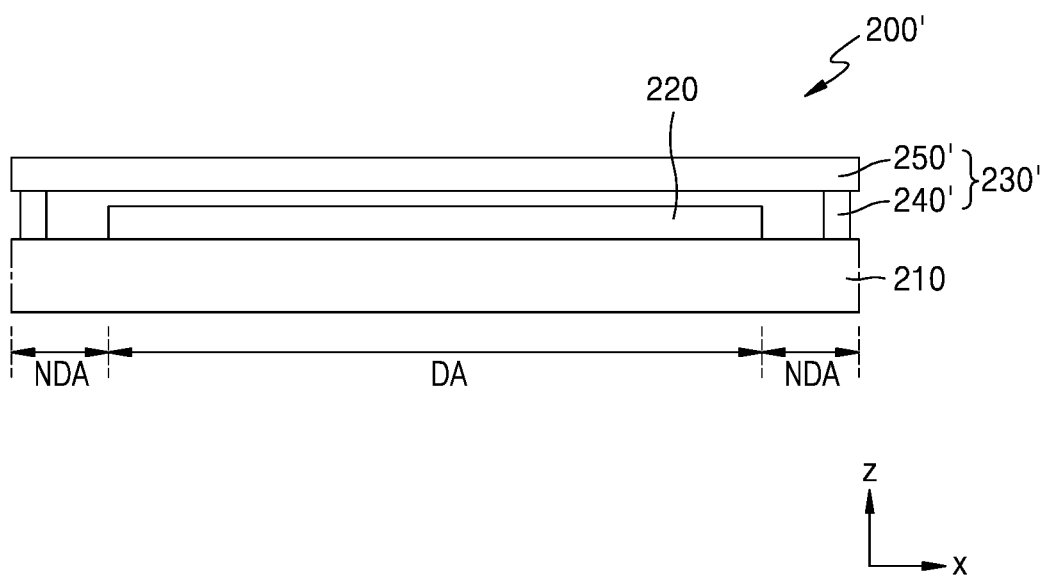

FIGS. 2A and 2B are schematic cross-sectional views illustrating a display device 200 according to an embodiment.

Referring to FIG. 2A, the display device 200 includes a display element layer 220 on a substrate 210 and an encapsulation member 230 covering the display element layer 220.

The substrate 210 may include a polymer resin, such as polyether sulfone, polyacrylate, polyether imide, polyethylene naphthalate, polyethylene terephthalate, polyphenylene sulfide, polyarylate, polyimide, polycarbonate, or cellulose acetate propionate. The substrate 210 may have a single-layer or multi-layer structure of the material, and in the case of a multi-layer structure, the substrate 210 may further include an inorganic layer (not shown). The substrate 210 may have flexible, rollable, or bendable characteristics.

The display element layer 220 may include pixels, and each of the pixels may include an organic light-emitting diode and a pixel circuit electrically connected to the organic light-emitting diode. The pixel circuit may include a thin film transistor, a storage capacitor, and conductive lines electrically connected to the thin film transistor and the storage capacitor, and may include insulating layers.

The encapsulation member 230 may protect the display element layer 220 from external foreign matters such as moisture. The encapsulation member 230 may be a thin film encapsulation layer including at least one inorganic encapsulation layer, for example, first and second encapsulation layers 240 and 260, and at least one organic encapsulation layer 250. Each of the first inorganic encapsulation layer 240 and the second inorganic encapsulation layer 260 may include a silicon oxide layer, a silicon nitride layer, a silicon oxynitride layer, a titanium oxide layer, an aluminum oxide layer, or/and the like. However, the disclosure is not limited thereto. The organic encapsulation layer 250 may include an acrylic-based organic material. However, the disclosure is not limited thereto.

Although the encapsulation member 230 of FIG. 2A may include the first inorganic encapsulation layer 240, the second inorganic encapsulation layer 260, and the organic encapsulation layer 250 therebetween, the disclosure is not limited thereto. The stacking order of the first inorganic encapsulation layer 240, the second inorganic encapsulation layer 260, and the organic encapsulation layer 250 may vary. Although it is illustrated in FIG. 2A that the encapsulation member 230 is a thin film encapsulation layer, the disclosure is not limited thereto.

Referring to FIG. 2B, the display device 200 may include an encapsulation member 230' including a seal portion 240' and an encapsulation substrate 250'. The substrate 210 of FIG. 2B may include the above-described polymer resin or include glass or the like.

The encapsulation substrate 250' may be arranged to face the substrate 210, and the seal portion 240' may be arranged between the substrate 210 and the encapsulation substrate 250'. The seal portion 240' may surround a display area DA. An inner space defined by the substrate 210, the encapsulation substrate 250', and the seal portion 240' may be spatially separated from the outside and may prevent penetration of moisture or impurities. The encapsulation substrate 250' may include the polymer resin or glass described above, and the seal portion 240' may use a material such as frit or epoxy.

Figure 3:
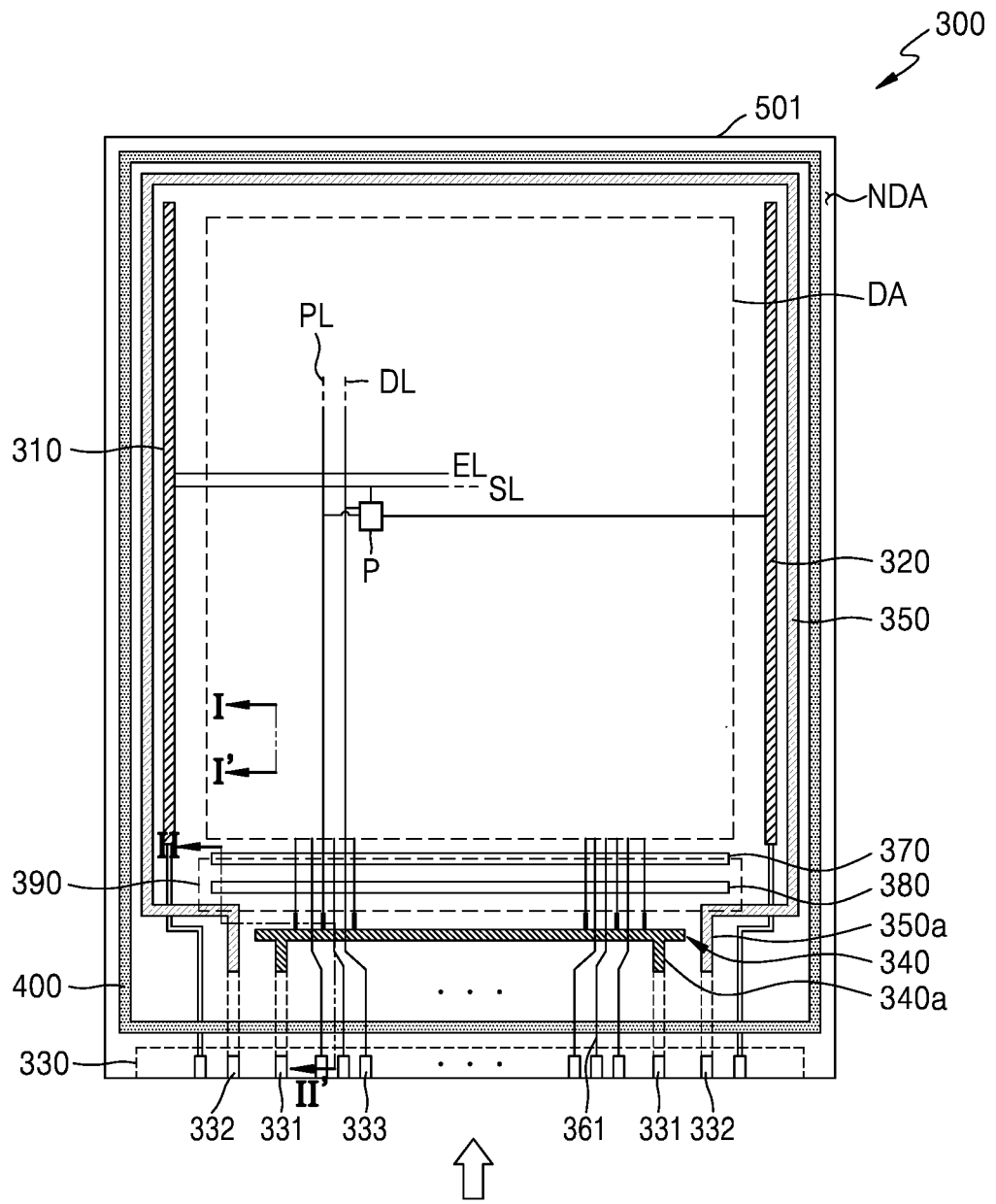
FIG. 3 is a schematic plan view illustrating a display device according to an embodiment.
Figure 3:
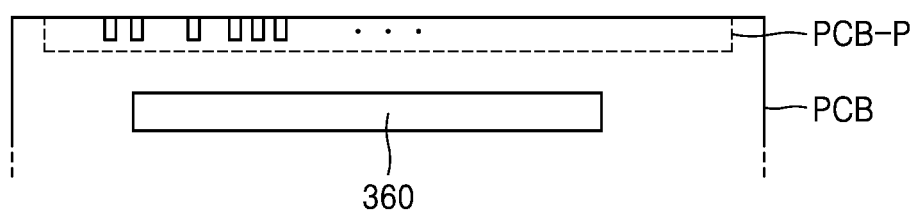
Figure 4A:
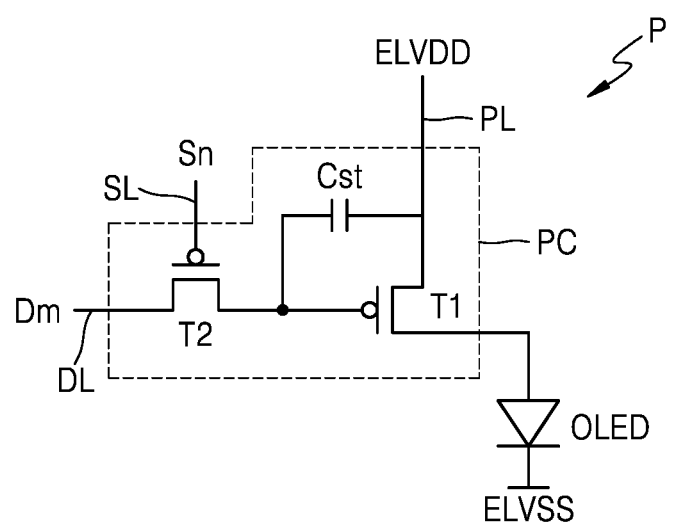
FIGS. 4A and 4B are equivalent circuit diagrams of a pixel according to an embodiment.
Figure 4B:
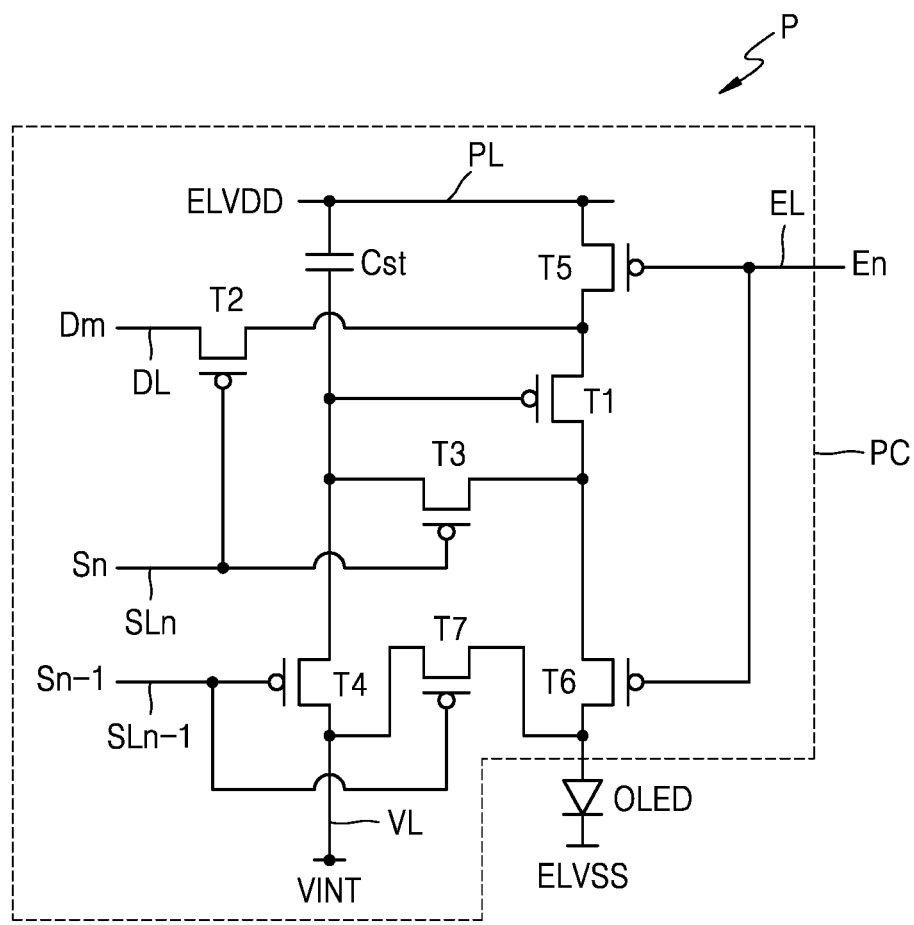

FIG. 3 is a schematic plan view illustrating a display device 300 according to an embodiment, and FIGS. 4A and 4B are equivalent circuit diagrams of a pixel according to an embodiment.

Referring to FIG. 3, the display device 300 includes pixels P arranged in a display area DA. Each of the pixels P may emit red, green, blue, or white light and may include, for example, an organic light-emitting diode. Furthermore, each of the pixels P may include an element such as a thin film transistor or a capacitor.

Referring to FIG. 4A, each pixel P may include a pixel circuit PC electrically connected to a scan line SL and a data line DL and an organic light-emitting diode OLED electrically connected to the pixel circuit PC. The pixel circuit PC may include a driving thin film transistor T1, a switching thin film transistor T2, and a storage capacitor Cst.

The switching thin film transistor T2 may transmit a data signal Dm input through the data line DL to the driving thin film transistor T1 according to a scan signal Sn input through the scan line SL.

The storage capacitor Cst is electrically connected to the switching thin film transistor T2 and a driving voltage line PL, and may store a voltage corresponding to a difference between a voltage received from the switching thin film transistor T2 and a first power voltage (or a driving voltage) ELVDD supplied to the driving voltage line PL.

The driving thin film transistor T1 is electrically connected to the driving voltage line PL and the storage capacitor Cst, and may control a driving current flowing through the organic light-emitting diode OLED from the driving voltage line PL in response to a voltage value stored in the storage capacitor Cst. A driving current may cause organic light-emitting diode OLED to emit light having a luminance.

FIG. 4A illustrates a case where the pixel circuit PC includes two thin film transistors and one storage capacitor. However, the disclosure is not limited thereto.

Referring to FIG. 4B, the pixel circuit PC may include a driving thin film transistor T1, a switching thin film transistor T2, a compensation thin film transistor T3, a first initialization thin film transistor T4, a first emission control thin film transistor T5, a second emission control thin film transistor T6, and a second initialization thin film transistor T7.

Although FIG. 4B illustrates a case where signal lines SLn, SLn-1, EL, and DL, an initialization voltage line VL, and a driving voltage line PL are provided for a pixel, the disclosure is not limited thereto. In another embodiment, at least one of the signal lines SLn, SLn-1, EL, and DL, and/or the initialization voltage line VL may be shared by neighboring pixels.

The drain electrode of the driving thin film transistor T1 may be electrically connected to the organic light-emitting diode OLED via the second emission control thin film transistor T6. The driving thin film transistor T1 may receive a data signal Dm according to a switching operation of the switching thin film transistor T2 and supply a driving current to the organic light-emitting diode OLED.

The gate electrode of the switching thin film transistor T2 may be electrically connected to a first scan line SLn, and the source electrode of the switching thin film transistor T2 may be electrically connected to a data line DL. The drain electrode of the switching thin film transistor T2 may be electrically connected to the source electrode of the driving thin film transistor T1 and may be electrically connected to the driving voltage line PL via the first emission control thin film transistor T5.

The switching thin film transistor T2 may be turned on according to a first scan signal Sn received through the first scan line SLn and perform a switching operation for transmitting the data signal Dm transmitted to the data line DL to the source electrode of the driving thin film transistor T1.

The gate electrode of the compensation thin film transistor T3 may be electrically connected to the first scan line SLn. The source electrode of the compensation thin film transistor T3 may be electrically connected to the drain electrode of the driving thin film transistor T1 and may be electrically connected to a pixel electrode of the organic light-emitting diode OLED via the second emission control thin film transistor T6. The drain electrode of the compensation thin film transistor T3 may be electrically connected to one electrode of the storage capacitor Cst, the source electrode of the first initialization thin film transistor T4, and the gate electrode of the driving thin film transistor T1. The compensation thin film transistor T3 may be turned on according to the first scan signal Sn received through the first scan line SLn to electrically connect the gate electrode and the drain electrode of the driving thin film transistor T1 to each other, and thus, the driving thin film transistor T1 may be diode-connected.

The gate electrode of the first initialization thin film transistor T4 may be electrically connected to a second scan line SLn-1 that is a previous scan line. The drain electrode of the first initialization thin film transistor T4 may be electrically connected to the initialization voltage line VL. The source electrode of the first initialization thin film transistor T4 may be electrically connected to one electrode of the storage capacitor Cst, the drain electrode of the compensation thin film transistor T3, and the gate electrode of the driving thin film transistor T1. The first initialization thin film transistor T4 may be turned on according to a second scan signal Sn-1 received through the second scan line SLn-1 and transmit an initialization voltage VINT to the gate electrode of the driving thin film transistor T1 to perform an initialization operation for initializing a voltage of the gate electrode of the driving thin film transistor T1.

The gate electrode of the first emission control thin film transistor T5 may be electrically connected to an emission control line EL. The source electrode of the first emission control thin film transistor T5 may be electrically connected to the driving voltage line PL. The drain electrode of the first emission control thin film transistor T5 may be electrically connected to the source electrode of the driving thin film transistor T1 and the drain electrode of the switching thin film transistor T2.

The gate electrode of the second emission control thin film transistor T6 may be electrically connected to the emission control line EL. The source electrode of the second emission control thin film transistor T6 may be electrically connected to the drain electrode of the driving thin film transistor T1 and the source electrode of the compensation thin film transistor T3. The drain electrode of the second emission control thin film transistor T6 may be electrically connected to the pixel electrode of the organic light-emitting diode OLED. The first emission control thin film transistor T5 and the second emission control thin film transistor T6 may be simultaneously turned on according to an emission control signal En transmitted through the emission control line EL, and thus, a first power voltage ELVDD may be transmitted to the organic light-emitting diode OLED and a driving current may flow through the organic light-emitting diode OLED.

The gate electrode of the second initialization thin film transistor T7 may be electrically connected to the second scan line SLn-1. The source electrode of the second initialization thin film transistor T7 may be electrically connected to the pixel electrode of the organic light-emitting diode OLED. The drain electrode of the second initialization thin film transistor T7 may be electrically connected to the initialization voltage line VL. The second initialization thin film transistor T7 may be turned on according to the second scan signal Sn-1 received through the second scan line SLn-1 to initialize the pixel electrode of the organic light-emitting diode OLED.

In FIG. 4B, the first initialization thin film transistor T4 and the second initialization thin film transistor T7 are electrically connected to the second scan line SLn-1. However, the disclosure is not limited thereto. In another embodiment, the first initialization thin film transistor T4 may be electrically connected to the second scan line SLn-1, which is the previous scan line, and driven according to the second scan signal Sn-1. The second initialization thin film transistor T7 may be electrically connected to a separate signal line (e.g., a next scan line) and may be driven according to a signal transmitted to the separate scan line.

One electrode of the storage capacitor Cst may be electrically connected to the gate electrode of the driving thin film transistor T1, the drain electrode of the compensation thin film transistor T3, and the source electrode of the first initialization thin film transistor T4. The other electrode of the storage capacitor Cst may be electrically connected to the driving voltage line PL.

An opposite electrode (e.g., a cathode) of the organic light-emitting diode OLED is supplied with a second power voltage (or a common power voltage) ELVSS. The organic light-emitting diode OLED may emit light by receiving a driving current from the driving thin film transistor T1.

The pixel circuit PC is not limited to a circuit design and the number of thin film transistors and storage capacitors described with reference to FIGS. 4A and 4B, and the number of thin film transistors and the circuit design may vary.

Referring back to FIG. 3, the non-display area NDA of the display device 300 may surround the display area DA. The non-display area NDA may be an area that does not provide an image.

A scan driving circuit 310 as a first outer circuit, a control driving circuit 320 as a second outer circuit, a terminal portion 330, a driving voltage supply line 340, and a common voltage supply line 350, and a seal portion 400 may be arranged in the non-display area NDA.

The scan driving circuit 310 may be arranged in the non-display area NDA of the substrate 501. The scan driving circuit 310 may be electrically connected to the scan line SL and may supply a scan signal to the scan line SL.

The control driving circuit 320 may be arranged in the non-display area NDA of the substrate 501. The scan driving circuit 310 and the control driving circuit 320 may be arranged to be in parallel with each other, with the display area DA arranged therebetween. The scan driving circuit 310 may be arranged around a first side edge of the display area DA, and the control driving circuit 320 may be arranged around a second side edge of the display area DA opposite to the first side edge.

The terminal portion 330 may be arranged at one end of the substrate 501. The terminal portion 330 may be exposed without being covered by an insulating layer and electrically connected to a printed circuit board (PCB). The terminal unit 330 may be arranged in the non-display area NDA where the scan driving circuit 310 and the control driving circuit 320 are not located. For example, the terminal portion 330 may be arranged to be in parallel with a third side of the display area DA.

A terminal PCB-P of the printed circuit board PCB may be electrically connected to the terminal portion 330 of the display device 300. The printed circuit board PCB may provide a power or signal from a controller (not shown) to the display device 300. A control signal generated by the controller may be transmitted to each of the scan driving circuit 310 and the control driving circuit 320 through the printed circuit board PCB.

The controller may provide the first power voltage ELVDD and the second power voltage ELVSS through a first connection line 340a and a second connection line 350a, respectively. The first power voltage ELVDD may be provided to each pixel P through the driving voltage line PL electrically connected to the driving voltage supply line 340, and the second power voltage ELVSS may be provided to the opposite electrode of the pixel P electrically connected to the common voltage supply line 350.

The data driving circuit 360 may be electrically connected to the data line DL. A data signal of the data driving circuit 360 may be provided to each pixel P through a wiring line 361 electrically connected to the terminal portion 330 and the data line DL electrically connected to the wiring line 361. FIG. 3 illustrates that the data driving circuit 360 is arranged on the printed circuit board PCB. However, the disclosure is not limited thereto. In another embodiment, the data driving circuit 360 may be arranged on the substrate 501. For example, the data driving circuit 360 may be arranged between the terminal portion 330 and the driving voltage supply line 340 illustrated in FIG. 3.

The driving voltage supply line 340 may be arranged in the non-display area NDA. The driving voltage supply line 340 may be arranged adjacent to a third side of the substrate 501. For example, the driving voltage supply line 340 may be arranged in a lower portion of the substrate 501 in the y-direction. The first connection line 340a may extend from the driving voltage supply line 340 toward the first terminal 331 arranged in the lower portion of the substrate 501 in the y-direction. The first connection line 340a may be electrically connected to a first terminal 331 of the terminal portion 330.

The common voltage supply line 350 may be arranged in the non-display area NDA. The common voltage supply line 350 may partially surround the display area DA along an edge of the display area DA. For example, the common voltage supply line 350 may have a loop shape, a portion of which corresponding to the lower portion of the substrate 501 in the y-direction is open. The second connection line 350a may extend in the y-direction in parallel with the first connection line 340a and may be electrically connected to a second terminal 332 of the terminal portion 330.

The controller may transmit different voltages to the driving voltage supply line 340 and the common voltage supply line 350 through the first terminal 331 and the second terminal 332, respectively. The common voltage supply line 350 may have a lower voltage than the driving voltage supply line 340. The controller may convert image signals transmitted from an external element into image data signals and transmit the image data signals to the display area DA through a third terminal 333 of the terminal portion 330.

An auxiliary common voltage supply line 370 may be further arranged in the non-display area NDA. The auxiliary common voltage supply line 370 may be arranged adjacent to the third side of the substrate 501. The auxiliary common voltage supply line 370 may be arranged in the lower portion of the substrate 501 in the y-direction. The auxiliary common voltage supply line 370 may be arranged between the display area DA and the common voltage supply line 350.

The display device 300 may further include a switching circuit 380 as a third outer circuit. The switching circuit 380 may be electrically connected to the data driving circuit 360 and the data line DL of the pixel P. The switching circuit 380 may include a demultiplexer that demultiplexes a data signal output from the data driving circuit 360 and supplies an output signal to the data line DL. The switching circuit 380 may be arranged between the common voltage supply line 350 and the auxiliary common voltage supply line 370.

The common voltage supply line 350 and the auxiliary common voltage supply line 370 may be spaced apart from each other with the switching circuit 380 arranged therebetween in the lower portion of the substrate 501 in the y-direction. The common voltage supply line 350 and the auxiliary common voltage supply line 370 may be electrically connected to each other through a connection electrode 390.

The seal portion 400 may surround the display area DA. The seal portion 400 may seal the display area DA from external air.

Figure 5:
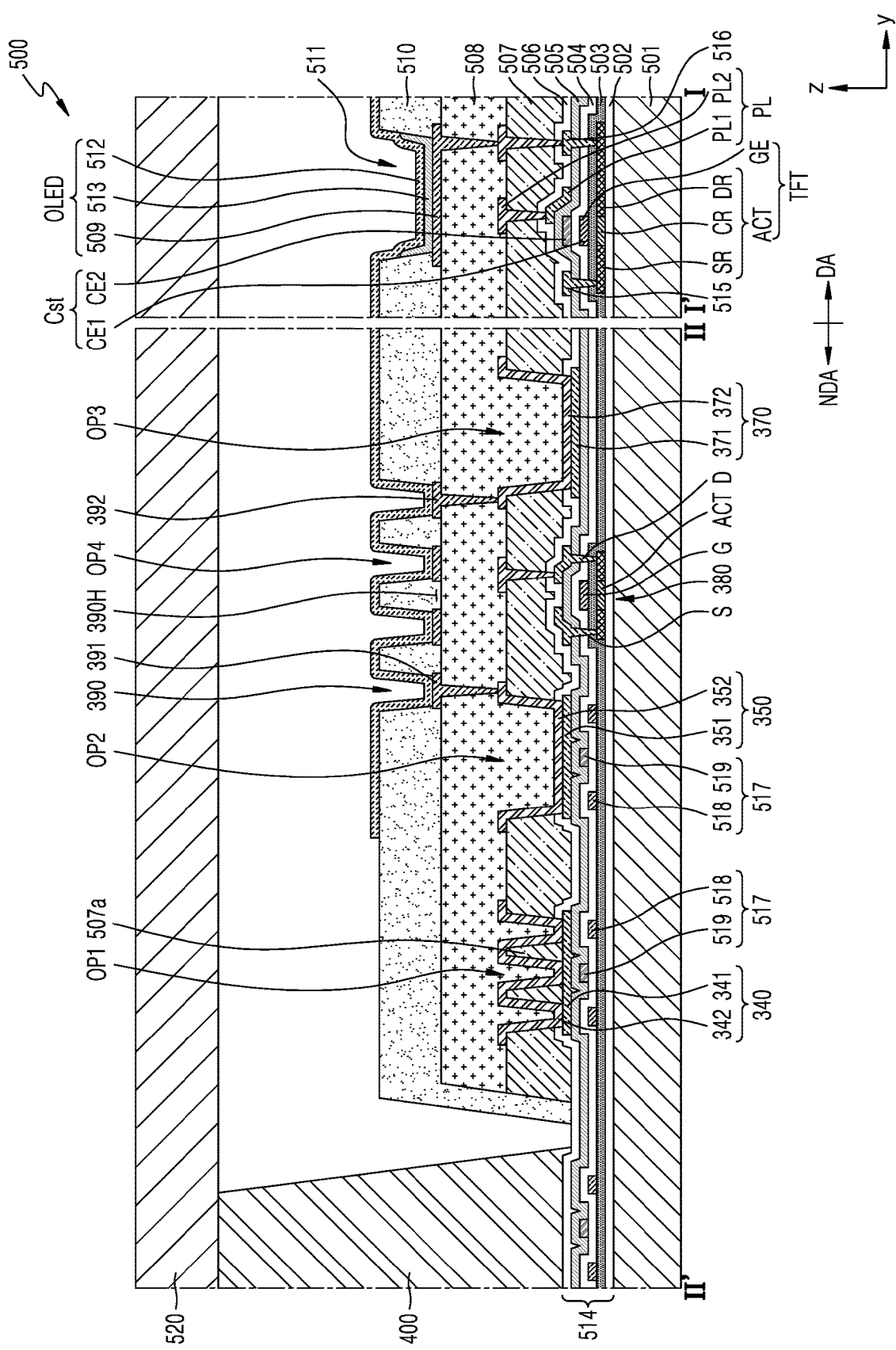
FIG. 5 is a schematic cross-sectional view of the display device taken along lines I-I' and II-II' of FIG. 3.

FIG. 5 is a schematic cross-sectional view of the display device 300 taken along lines I-I' and II-II' of FIG. 3.

Referring to FIG. 5, in region I-I', which is a portion of a cross section of the display area DA, a buffer layer 502 may be arranged on the substrate 501. The buffer layer 502 may block foreign matters or moisture that penetrates through the substrate 501. For example, the buffer layer 502 may include an inorganic material such as silicon oxide, silicon nitride, and/or silicon oxynitride and may include a single layer or multiple layers.

A thin film transistor TFT and a storage capacitor Cst, and an organic light-emitting diode OLED electrically connected to the thin film transistor TFT and the storage capacitor Cst may be arranged on the substrate 501. The thin film transistor TFT includes a semiconductor layer ACT and a gate electrode GE. The semiconductor layer ACT may include polysilicon, amorphous silicon, oxide semiconductor, organic semiconductor material, or the like. In an embodiment, the semiconductor layer ACT may include a channel region CR overlapping the gate electrode GE, and a source region SR and a drain region DR arranged on both sides of the channel region CR and including impurities at a higher concentration than in the channel region CR. In this case, the impurities may include N-type impurities or P-type impurities. The source region SR and the drain region DR may be electrically connected to a source electrode 515 and a drain electrode 516, respectively.

A gate insulating layer 503 may be arranged between the semiconductor layer ACT and the gate electrode GE. The gate insulating layer 503 may be an inorganic material layer including silicon oxynitride, silicon oxide, and/or silicon nitride, and the inorganic material layer may include a single layer or multiple layers.

The storage capacitor Cst includes a first storage capacitor plate CE1 and a second storage capacitor plate CE2, which overlap each other. A first interlayer insulating layer 504 may be arranged between the first storage capacitor plate CE1 and the second storage capacitor plate CE2. The first interlayer insulating layer 504 may be a layer having a dielectric constant. The first interlayer insulating layer 504 may be an inorganic material layer including silicon oxynitride, silicon oxide, and/or silicon nitride and may include a single layer or multiple layers.

Although FIG. 5 illustrates a case where the storage capacitor Cst overlaps the thin film transistor TFT and the first storage capacitor plate CE1 is the gate electrode of the thin film transistor TFT, the disclosure is not limited thereto. In another embodiment, the storage capacitor Cst may not overlap the thin film transistor TFT, and the first storage capacitor plate CE1 may be an independent component separate from the gate electrode GE of the thin film transistor TFT.

The storage capacitor Cst may be covered by a second interlayer insulating layer 505. The second interlayer insulating layer 505 may be an inorganic material layer including silicon oxynitride, silicon oxide, and/or silicon nitride, and may include a single layer or multiple layers.

The driving voltage line PL may include a first driving voltage line PL1 and a second driving voltage line PL2. The first driving voltage line PL1 may include aluminum (Al), copper (Cu), titanium (Ti), or the like and may include multiple layers or a single layer. In an embodiment, the first driving voltage line PL1 may have a multilayer structure of Ti/Al/Ti. The first driving voltage line PL1 may be covered by a first planarization layer 507. An inorganic protective layer 506 for protecting conductive lines may be further arranged under the first planarization layer 507. The conductive lines and the first driving voltage line PL1 may be arranged on a same layer.

The second driving voltage line PL2 may be arranged on the first driving voltage line PL1 with the first planarization layer 507 arranged therebetween and may be electrically connected to the first driving voltage line PL1 through a contact hole formed in the first planarization layer 507. The second driving voltage line PL2 may include Al, Cu, Ti, or the like and may include multiple layers or a single layer. In an embodiment, the second driving voltage line PL2 may have a multilayer structure of Ti/Al/Ti. The first planarization layer 507 may include an organic insulating material; and the organic insulating material may include an imide polymer, a general purpose polymer such as polymethylmethacrylate or polystyrene, a polymer derivative having a phenolic group, an acrylic polymer, an aryl ether polymer, an amide polymer, a fluorine polymer, a p-xylene polymer, a vinyl alcohol polymer, or a blend thereof. In an embodiment, the first planarization layer 507 may include polyimide.

The driving voltage line PL may be covered by a second planarization layer 508, and the second planarization layer 508 may include an organic insulating material. For example, the second planarization layer 508 may include an imide polymer, a general purpose polymer such as polymethylmethacrylate or polystyrene, a polymer derivative having a phenolic group, an acrylic polymer, an aryl ether polymer, an amide polymer, a fluorine polymer, a p-xylene polymer, a vinyl alcohol polymer, or a blend thereof. In an embodiment, the second planarization layer 508 may include polyimide.

A pixel electrode 509 may be arranged on the second planarization layer 508. A pixel-defining layer 510 may be arranged on the pixel electrode 509. The pixel-defining layer 510 may have an opening corresponding to each pixel, for example, an opening 511 exposing a portion of the pixel electrode 509 and defining a pixel. In addition, the pixel-defining layer 510 may increase a distance between an edge of the pixel electrode 509 and the opposite electrode 512 and may prevent an arc or the like from being formed therebetween. The pixel-defining layer 510 may include an organic material such as polyimide or hexamethyldisiloxane.

An intermediate layer 513 may include a low molecular weight material or a polymer material.

In case that the intermediate layer 513 includes a low molecular weight material, the intermediate layer 513 may have a structure in which a hole injection layer, a hole transport layer, an emission layer, an electron transport layer, an electron injection layer, and the like are stacked in a single or composite structure. The intermediate layer 513 may include various organic materials, such as copper phthalocyanine, N,N'-Di(naphthalene-1-yl)-N, N'-diphenyl-benzidine, and tris-8-hydroxyquinoline aluminum (Alq3). These layers may be formed by an evaporation method.

In case that the intermediate layer 513 includes a polymer material, the intermediate layer 513 may have a structure including a hole transport layer and an emission layer. The hole transport layer may include poly(3,4-ethylenedioxy-thiophene) (PEDOT); and the emission layer may include a polymer material, such as poly-phenylenevinylene (PPV)-based polymer or polyfluorene-based polymer. The structure of the intermediate layer 513 is not limited to the above, and the intermediate layer 513 may have various structures. For example, at least one of the layers constituting the intermediate layer 513 may be integrally formed over pixel electrodes 509. Alternatively, the intermediate layer 513 may include a layer patterned to correspond to each of the pixel electrodes 509.

The opposite electrode 512 may be arranged above the display area DA to cover the display area DA. Specifically, the opposite electrode 512 may be formed as a single body to cover pixels.

In region II-II' of FIG. 5, which is a portion of a cross section of the display area DA, an inorganic insulating layer 514 may be arranged on the substrate 501. The inorganic insulating layer 514 may include at least one of the buffer layer 502, the gate insulating layer 503, the first interlayer insulating layer 504, and the second interlayer insulating layer 505.

The driving voltage supply line 340, the common voltage supply line 350, the auxiliary common voltage supply line 370, the switching circuit 380, and the seal portion 400 may be arranged in the non-display area NDA.

The driving voltage supply line 340 may include a first layer 341 and a second layer 342, the second layer 342 being electrically connected to the first layer 341. The first layer 341 may be arranged on the second interlayer insulating layer 505. The first layer 341, the source electrode 515, and the drain electrode 516 may be arranged on a same layer and may include a same material.

The first layer 341 may be covered by the first planarization layer 507. The first planarization layer 507 may include a first opening OP1 through which at least a portion of the first layer 341 is exposed. Separate portions 507a of the first planarization layer 507 may be arranged in the opening OP1 to be spaced apart from each other.

The second layer 342 may be arranged on the first planarization layer 507. A portion of the second layer 342 may contact the first layer 341 through the opening OP1. The second layer 342 may cover the separate portions 507a of the first planarization layer 507 arranged in the opening OP1 to increase a contact area. The second layer 342 and a conductive line such as the second driving voltage line PL2 may be arranged on a same layer and may include a same material. The second layer 342 may be covered by the second planarization layer 508.

The first layer 341 for a driving voltage supply line and the second layer 342 for a driving voltage supply line, which are electrically connected to each other, may form (or constitute) the driving voltage supply line 340 that provides the first power voltage ELVDD to each pixel P through the driving voltage line PL. In an embodiment, the driving voltage supply line 340 has a structure in which the first layer 341 and the second layer 342 are stacked, but is not limited thereto. For example, the driving voltage supply line 340 may include only one of the first layer 341 and the second layer 342. The driving voltage supply line 340 may have any structure capable of providing the first power voltage ELVDD to each pixel P.

The common voltage supply line 350 may be arranged closer to the display area DA than the driving voltage supply line 340. For example, the common voltage supply line 350 may be arranged between the display area DA and the driving voltage supply line 340 in a lower portion of the substrate 501 in the y-direction of FIG. 3.

The common voltage supply line 350 includes a first layer 351 for a common voltage supply line and a second layer 352 for a common voltage supply line, the second layer 352 being electrically connected to the first layer 351. The first layer 351 may be arranged on the second interlayer insulating layer 505. The first layer 351, the source electrode 515, and the drain electrode 516 may be arranged on a same layer and may include a same material.

The first layer 351 may be covered by the first planarization layer 507. The first planarization layer 507 may include a second opening OP2 through which at least a portion of the first layer 351 is exposed. The second layer 352 may be arranged on the first planarization layer 507. A portion of the second layer 352 may contact the first layer 351 through the second opening OP2. The second layer 352 and a conductive line such as the second driving voltage line PL2 may be arranged on a same layer and may include a same material. The second layer 352 may be covered by the second planarization layer 508.

The first layer 351 and the second layer 352 for a common voltage supply line, which are electrically connected to each other, may form (or constitute) the common voltage supply line 350 that provides the second power voltage ELVSS to each pixel P through the connection electrode 390 and the opposite electrode 512. In an embodiment, the common voltage supply line 350 has a structure in which the first layer 351 and the second layer 352 are stacked, but is not limited thereto. For example, the common voltage supply line 350 may include only one of the first layer 351 or the second layer 352. The common voltage supply line 350 may have any structure capable of providing the second power voltage ELVSS to each pixel P.

A fan-out line 517 may be arranged under the driving voltage supply line 340 and the common voltage supply line 350. The fan-out line 517 includes a first fan-out line 518 arranged on the gate insulating layer 503 and a second fan-out line 519 arranged on the first interlayer insulating layer 504. Because the first fan-out line 518 and the second fan-out line 519 are arranged on different layers with the first interlayer insulating layer 504 therebetween, more fan-out lines 517 may be arranged in the same area and a short between the fan-out lines 517 may be prevented.

The auxiliary common voltage supply line 370 may be arranged closer to the display area DA than the common voltage supply line 350. Specifically, the auxiliary common voltage supply line 370 may be arranged between the display area DA and the common voltage supply line 350 in the lower portion of the substrate 501 in the y-direction of FIG. 3. The auxiliary common voltage supply line 370 may be installed to prevent a voltage drop of the common voltage supply line 350.

The auxiliary common voltage supply line 370 and the common voltage supply line 350 may have substantially a same stacked structure. The auxiliary common voltage supply line 370 includes a first layer 371 for an auxiliary common voltage supply line and a second layer 372 for an auxiliary common voltage supply line, the second layer 372 being electrically connected to the first layer 371. As the common voltage supply line 350, the second layer 372 may contact the first layer 371 through a third opening OP3 of the first planarization layer 507 through which at least a portion of the first layer 371 is exposed. In another embodiment, the auxiliary common voltage supply line 370 may have a stacked structure different from that of the common voltage supply line 350.

The common voltage supply line 350 and the auxiliary common voltage supply line 370 may be electrically connected to each other through the connection electrode 390. The connection electrode 390 may be arranged on the common voltage supply line 350 and the auxiliary common voltage supply line 370. For example, the connection electrode 390 may be arranged on the second planarization layer 508. The connection electrode 390 may cover one edge of the common voltage supply line 350 and one edge of the auxiliary common voltage supply line 370, which face each other.

The connection electrode 390 and the pixel electrode 509 may be arranged on a same layer and may include a same material. The connection electrode 390 may include holes 390H. The pixel-defining layer 510 may include a fourth opening OP4 exposing at least a portion of the connection electrode 390. The pixel-defining layer 510 may expose a portion of the connection electrode 390 and cover an edge of the connection electrode 390 in a portion where each of the holes 390H is arranged.

The opposite electrode 512 may electrically contact the connection electrode 390 through the fourth opening OP4. A first portion 391 of the connection electrode 390 may be electrically connected to the common voltage supply line 350 through a contact hole formed in the second planarization layer 508, and a second portion 392 of the connection electrode 390 may be electrically connected to the auxiliary common voltage supply line 370 through a contact hole formed in the second planarization layer 508.

As such, the common voltage supply line 350 may be electrically connected to the auxiliary common voltage supply line 370 through the first portion 391 of the connection electrode 390, the opposite electrode 512, and the second portion 392 of the connection electrode 390.

The switching circuit 380 may be arranged between the common voltage supply line 350 and the auxiliary common voltage supply line 370. For example, in the lower portion of the substrate 501 in the y-direction of FIG. 3, the common voltage supply line 350 and the auxiliary common voltage supply line 370 may be spaced apart from each other with the switching circuit 380 arranged therebetween. The switching circuit 380 may receive a data signal from the controller and may distribute or supply the data signal to pixels P. The switching circuit 380 may include at least one thin film transistor TFT. The thin film transistor TFT includes a semiconductor layer ACT, a gate electrode G, a source electrode S, and a drain electrode D.

An area, in which the common voltage supply line 350 and the opposite electrode 512 are electrically connected to each other, may be arranged on the switching circuit 380. For example, an area, in which the common voltage supply line 350, the first portion 391 of the connection electrode 390, the opposite electrode 512, the second portion 392 of the connection electrode 390, and the auxiliary common voltage supply line 370 are electrically connected to one another, may be arranged around an upper portion of the switching circuit 380.

The seal portion 400 may be arranged between the substrate 501 and an encapsulation substrate 520. The seal portion 400 may surround the display area DA. The seal portion 400 may include epoxy, sealant, glass, or frit. The encapsulation substrate 520 may include glass, plastic, or metal. The seal portion 400 may be cured using a heat source such as resistive heat or laser to bond the substrate 501 and the encapsulation substrate 520 together. The seal portion 400 may be bonded to the substrate 501 and the encapsulation substrate 520 to prevent external moisture, air, etc., from penetrating into the display area DA.

In an embodiment, the display area DA may be sealed with a thin film encapsulation layer including at least one inorganic encapsulation layer and at least one organic encapsulation layer. The thin film encapsulation layer may cover the display area DA and may extend outside the display area DA.

In the non-display area NDA, the auxiliary common voltage supply line 370, the switching circuit 380, the common voltage supply line 350, the driving voltage supply line 340, and the seal portion 400 may be arranged in this order (i.e., the non-display area NDA, the auxiliary common voltage supply line 370, the switching circuit 380, the common voltage supply line 350, the driving voltage supply line 340, and the seal portion 400) in a direction away from the display area DA.

The area, in which the common voltage supply line 350 and the opposite electrode 512 are electrically connected to each other, may be arranged between the display area DA and the driving voltage supply line 340, not between the driving voltage supply line 340 and the seal portion 400. Therefore, a connection portion between the common voltage supply line 350 for applying the second power voltage ELVSS and the opposite electrode 512 may not be affected by a margin between the seal portion 400 and the end of the opposite electrode 512. For example, in case that an area of the non-display area NDA in the lower portion of the substrate 501 in the y-direction of FIG. 3 is reduced, a space, in which the common voltage supply line 350 and the opposite electrode 512 are electrically connected to each other, may not be insufficient because the connection portion between the common voltage supply line 350 and the opposite electrode 512 is arranged closer to the display area DA than a region where the driving voltage supply line 340 is arranged.

In addition, the driving voltage supply line 340 may be arranged in a direction away from and farther from the display area DA than the common voltage supply line 350 is. The driving voltage supply line 340 may be arranged adjacent to the seal portion 400. The driving voltage supply line 340 may be electrically connected to the pixel P. For example, the driving voltage supply line 340 may be electrically connected to the pixel P through a conductive line such as the driving voltage line PL, which passes through a region where the common voltage supply line 350, the switching circuit 380, and the auxiliary common voltage supply line 370 are arranged.

Figure 6:
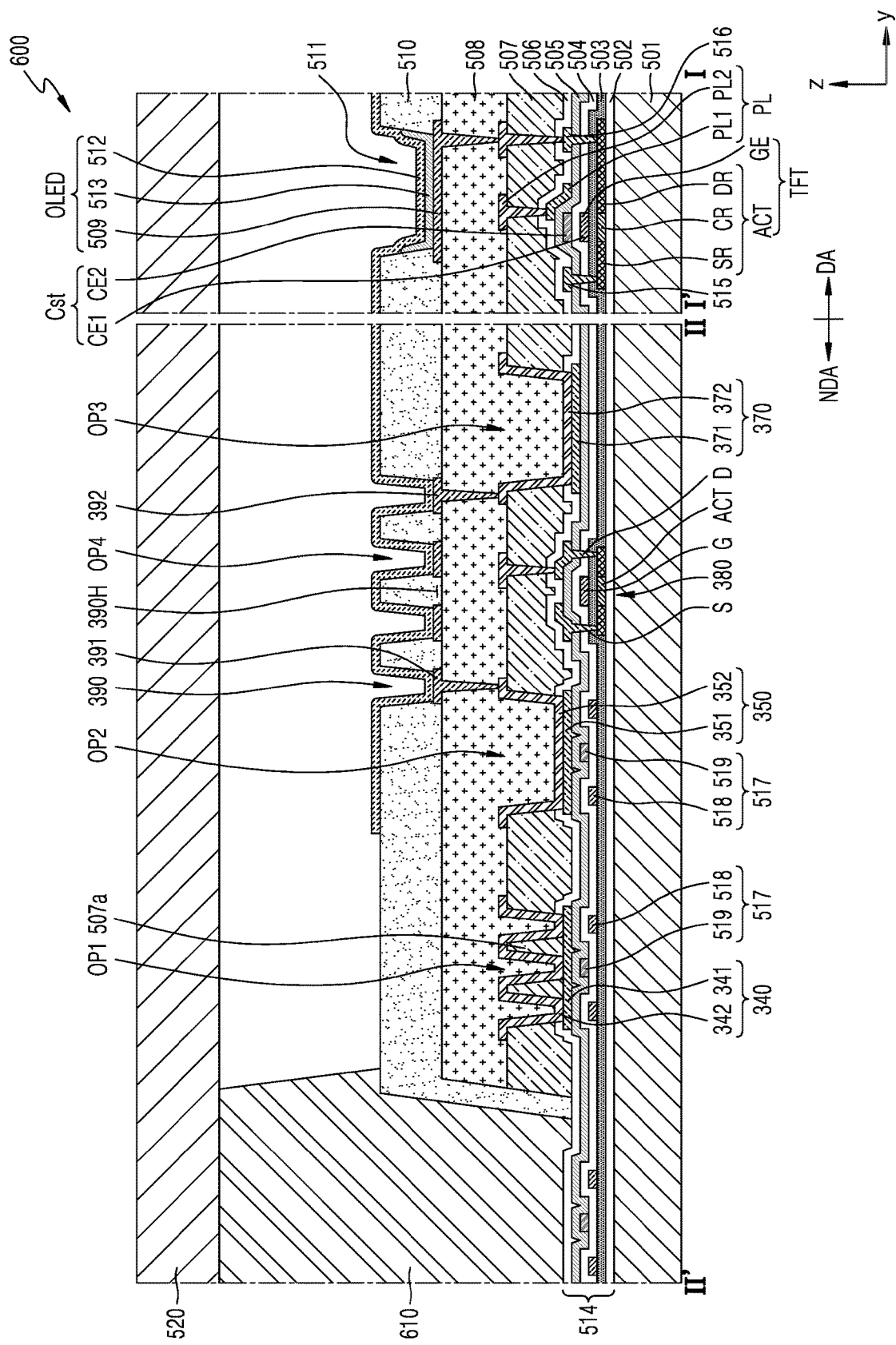
FIG. 6 is a schematic cross-sectional view of a display device modified from an embodiment shown in FIG. 5.

As illustrated in FIG. 6, in an embodiment of a display device 600, a driving voltage supply line 340 and a seal portion 610 may overlap each other. Specifically, a first planarization layer 507, a second planarization layer 508, and a pixel-defining layer 510 may be arranged on the driving voltage supply line 340. At least a portion of the seal portion 610 may cover the top and side surfaces of the pixel-defining layer 510 arranged on the driving voltage supply line 340. Accordingly, the non-display area NDA in a lower portion of the substrate 501 in the y-direction of FIG. 3 may be further reduced.

Figure 7:
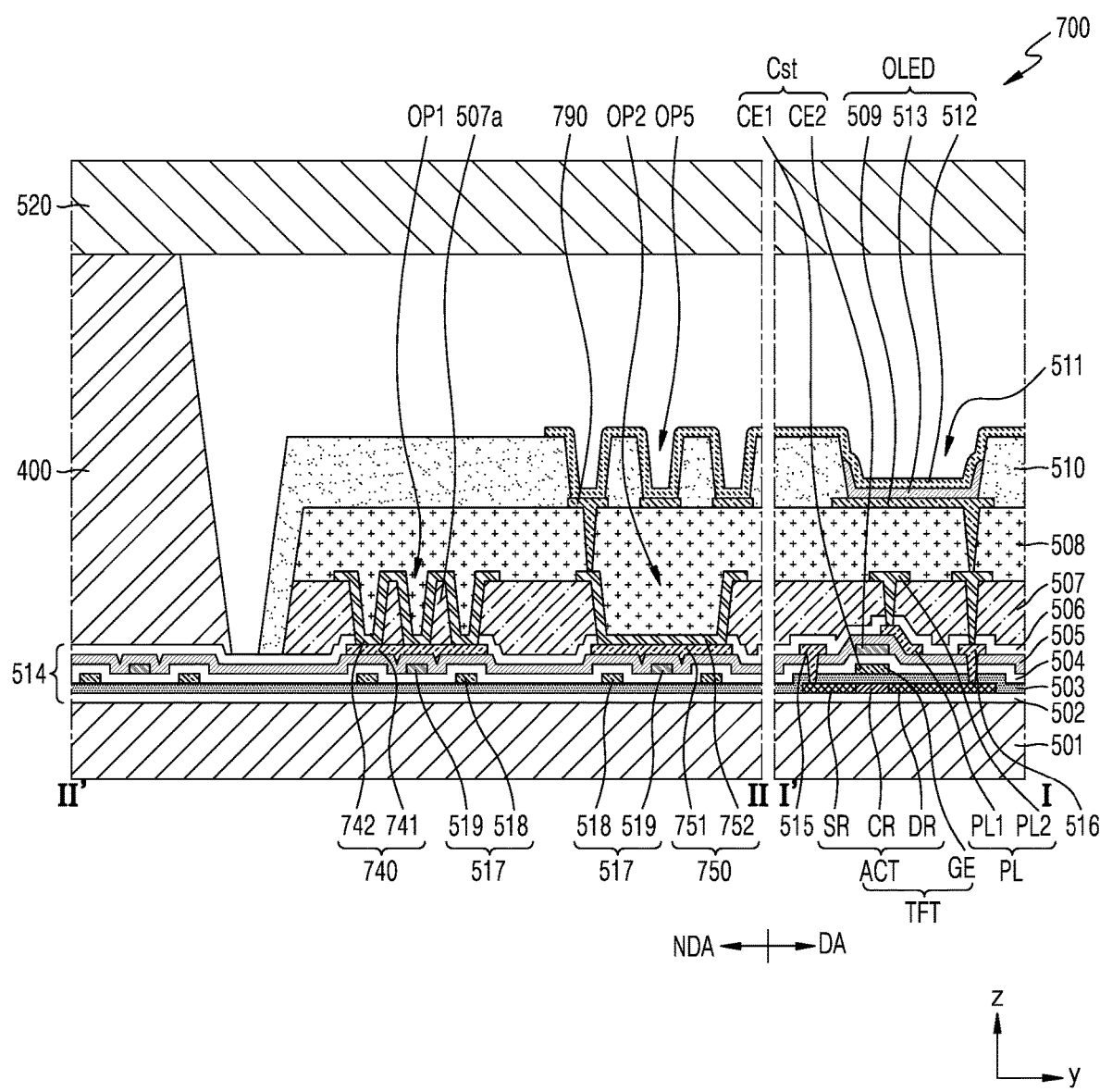
FIG. 7 is a schematic cross-sectional view illustrating a display device according to another embodiment.

FIG. 7 is a schematic cross-sectional view illustrating a display device 700 according to an embodiment.

The display device 700 of FIG. 7 and the display device 500 of FIG. 5 have substantially a same structure, except for the absence of the auxiliary common voltage supply line 370 and the switching circuit 380 of FIG. 5, and thus, differences between the display device 700 and the display device 500 will be mainly described below.

Referring to FIG. 7, a driving voltage supply line 740 includes a first layer 741 for a driving voltage supply line and a second layer 742 for a driving voltage supply line, the second layer 742 being electrically connected to the first layer 741. The driving voltage supply line 740 may be arranged adjacent to the seal portion 400.

A common voltage supply line 750 may be arranged closer to the display area DA than the driving voltage supply line 740. For example, the common voltage supply line 750 may be arranged between the display area DA and the driving voltage supply line 740. The common voltage supply line 750 includes a first layer 751 for a common voltage supply line and a second layer 752 for a common voltage supply line, the second layer 752 being electrically connected to the first layer 751.

The common voltage supply line 750 may be electrically connected to an opposite electrode 512 through a connection electrode 790. The connection electrode 790 may be arranged on the common voltage supply line 750. The connection electrode 790 and a pixel electrode 509 may be arranged on a same layer. The opposite electrode 512 may electrically contact the connection electrode 790 through a fifth opening OP5 formed in a pixel-defining layer 510. The connection electrode 790 may be electrically connected to the common voltage supply line 750 through a contact hole defined in a second planarization layer 508.

In a non-display area NDA, the common voltage supply line 750, the driving voltage supply line 740, and the seal portion 400 may be arranged in this order (i.e., a non-display area NDA, the common voltage supply line 750, the driving voltage supply line 740, and the seal portion 400) in a direction away from the display area DA. Because an area, in which the common voltage supply line 750 and the opposite electrode 512 are electrically connected to each other, is arranged closer to the display area DA than the driving voltage supply line 740, the non-display area NDA in the lower portion of the substrate 501 may be reduced and the common voltage supply line 750 and the opposite electrode 512 may be easily connected.

A display device according to one or more embodiments may reduce a voltage drop phenomenon and may include a non-display area having a reduced area.

Effects of the inventive concept may be derived from the descriptions given above with reference to the drawings, in addition to the effect described above.

It should be understood that embodiments described herein should be considered in a descriptive sense only and not for purposes of limitation. Descriptions of features or aspects within each embodiment should typically be considered as available for other similar features or aspects in other embodiments. While embodiments have been described with reference to the figures, it will be understood by those of ordinary skill in the art that various changes in form and detail may be made therein without departing from the spirit and scope as defined by the following claims.

What is claimed is:

1. A display device comprising:
    a substrate comprising a display area displaying an image and a non-display area adjacent to the display area;
    a plurality of pixels arranged in the display area, each of the plurality of pixels comprising:
        a pixel circuit; and
        a light-emitting diode including:
            a pixel electrode electrically connected to the pixel circuit;
            an emission layer; and
            an opposite electrode;
    a driving voltage supply line arranged in the non-display area, the driving voltage supply line supplying a driving voltage to the plurality of pixels;
    a common voltage supply line arranged in the non-display area and electrically connected to the opposite electrode to supply a common voltage; and
    a seal portion surrounding the display area,
    wherein in a cross-sectional view of an area adjacent to a terminal portion, the common voltage supply line, the driving voltage supply line, and the seal portion are arranged in a direction away from the display area in an order of the common voltage supply line, the driving voltage supply line, and the seal portion such that a distance between a side of the display area facing the terminal portion and the common voltage supply line is less than a distance between the side of the display area and the driving voltage supply line in a direction perpendicular to the side of the display area.

2. The display device of claim 1, wherein the common voltage supply line is electrically connected to the opposite electrode through a connection electrode, the connection electrode and the pixel electrode being arranged on a same layer.

3. The display device of claim 2, further comprising:
    an auxiliary common voltage supply line arranged between the common voltage supply line and the display area, and
    a switching circuit comprising at least one thin film transistor arranged between the common voltage supply line and the auxiliary common voltage supply line, the at least one thin film transistor supplying a data signal to the plurality of pixels.

4. The display device of claim 3, wherein the common voltage supply line and the auxiliary common voltage supply line have a same stacked structure and are electrically connected to each other through the connection electrode.

5. The display device of claim 4, wherein an area in which the common voltage supply line, the auxiliary common voltage supply line, the connection electrode, and the opposite electrode are electrically connected to one another, is arranged around an upper portion of the switching circuit.

6. The display device of claim 2, wherein the connection electrode electrically connected to the opposite electrode is arranged on the common voltage supply line.

7. The display device of claim 2, wherein the driving voltage supply line includes a conductive line electrically connected to the plurality of pixels through the common voltage supply line and through an area where the common voltage supply line and the opposite electrode are electrically connected to each other.

8. The display device of claim 2, wherein:
a planarization layer including at least one layer covers the common voltage supply line,
the connection electrode is arranged on the planarization layer and is electrically connected to the common voltage supply line through a contact hole of the planarization layer, and
the opposite electrode is electrically connected to the connection electrode through an opening of a pixel-defining layer covering at least a portion of the pixel electrode.

9. The display device of claim 8, wherein the display area includes:
a thin film transistor having a semiconductor layer, a gate electrode, a source electrode, and a drain electrode;
a first planarization layer provided in the planarization layer covering the source electrode;
a conductive line on the first planarization layer; and
a second planarization layer provided in the planarization layer covering the conductive line, wherein
the common voltage supply line includes a first layer and a second layer,
the first layer and the source electrode are arranged on a same layer, and
the second layer and the conductive line are arranged on a same layer.

10. The display device of claim 8, wherein:
the connection electrode includes a plurality of holes,
the pixel-defining layer covers an edge of the connection electrode in which the plurality of holes are arranged, and
the opening of the pixel-defining layer exposes a portion of the connection electrode electrically connected to the opposite electrode.

11. The display device of claim 1, wherein the display area includes:
a thin film transistor having a semiconductor layer, a gate electrode, a source electrode, and a drain electrode;
a first planarization layer covering the source electrode;
a conductive line on the first planarization layer; and
a second planarization layer covering the conductive line, wherein
the driving voltage supply line comprises a first layer and a second layer,
the first layer and the source electrode are arranged on a same layer, and
the second layer and the conductive line are arranged on a same layer.

12. The display device of claim 1, wherein the driving voltage supply line is arranged adjacent to the seal portion.

13. The display device of claim 1, wherein at least a portion of the seal portion overlaps the driving voltage supply line.

14. A display device comprising:
a substrate comprising a display area displaying an image and a non-display area adjacent to the display area;
a plurality of pixels arranged in the display area, each of the plurality of pixels comprising:
a pixel circuit; and
a light-emitting diode including:
a pixel electrode electrically connected to the pixel circuit;
an emission layer; and
an opposite electrode;
a pixel-defining layer arranged on the pixel electrode;
a driving voltage supply line arranged in the non-display area, the driving voltage supply line supplying a driving voltage to the plurality of pixels; and
a common voltage supply line arranged in the non-display area and electrically connected to the opposite electrode to supply a common voltage, wherein
the common voltage supply line is electrically connected to the opposite electrode through a connection electrode, the connection electrode and the pixel electrode being arranged on a same layer,
the connection electrode overlaps a transistor in a plan view,
the connection electrode includes a plurality of holes,
the pixel-defining layer covers an edge of the connection electrode in which the plurality of holes are arranged, and
the driving voltage supply line includes a first layer that is disposed in a plurality of openings formed by a plurality of separate portions.

15. The display device of claim 14, wherein:
a planarization layer including at least one layer covers the common voltage supply line,
the connection electrode is arranged on the planarization layer and is electrically connected to the common voltage supply line through a contact hole of the planarization layer, and
the opposite electrode is electrically connected to the connection electrode through an opening of the pixel-defining layer covering at least a portion of the pixel electrode.

16. The display device of claim 15, wherein the opening of the pixel-defining layer exposes a portion of the connection electrode electrically connected to the opposite electrode.

17. The display device of claim 14, wherein the display area comprises:
a thin film transistor having a semiconductor layer, a gate electrode, a source electrode, and a drain electrode;
a first planarization layer covering the source electrode;
a conductive line on the first planarization layer; and
a second planarization layer covering the conductive line, wherein
the driving voltage supply line further comprises a second layer disposed under the first layer and electrically connected to the first layer,
the second layer and the source electrode are arranged on a same layer, and
the first layer and the conductive line are arranged on a same layer.

18. The display device of claim 14, further comprising:
an auxiliary common voltage supply line electrically connected to the common voltage supply line through the connection electrode, the auxiliary common voltage supply line being arranged between the common voltage supply line and the display area, and
a switching circuit including at least one thin film transistor arranged between the common voltage supply line and the auxiliary common voltage supply line, the at least one thin film transistor supplying a data signal to the plurality of pixels.

19. The display device of claim 18, wherein the auxiliary common voltage supply line, the switching circuit, the common voltage supply line, and the driving voltage supply line are arranged in a direction away from the display area in an order of the auxiliary common voltage supply line, the switching circuit, the common voltage supply line, and the driving voltage supply line.

20. The display device of claim 14, wherein the common voltage supply line and the driving voltage supply line are arranged in a direction away from the display area in an order of the common voltage supply line and the driving voltage supply line.

* * * * *